June 19, 1962 F. K. BUELOW 3,040,190

HIGH SPEED, SENSITIVE BINARY TRIGGER UTILIZING TWO SERIES CONNECTED NEGATIVE RESISTANCE DIODES WITH VARIABLE BIAS FEEDBACK

Filed Dec. 23, 1960 2 Sheets-Sheet 1

INVENTOR
FRED K. BUELOW
BY Joseph C. Redmond, Jr.
ATTORNEY

United States Patent Office 3,040,190 Patented June 19, 1962

3,040,190

HIGH SPEED, SENSITIVE BINARY TRIGGER UTILIZING TWO SERIES CONNECTED NEGATIVE RESISTANCE DIODES WITH VARIABLE BIAS FEEDBACK

Fred K. Buelow, Poughkeepsie, N.Y., assignor to International Business Machines Corporation, New York, N.Y., a corporation of New York Filed Dec. 23, 1960, Ser. No. 78,074
7 Claims. (Cl. 307—88.5)

This invention relates to electronic switching circuits and more particularly to bistable pulse circuits.

Electronic switching circuits employed in computers and other information handling apparatus are limited to input pulse repetition rates of less than one hundred megacycles due in part, at least, to the cut off frequencies of the active elements, typically transistors utilized in the circuit. Recently, however, a rugged, inexpensive bistable semiconductor device has been developed which has also switching speeds of the order of several hundreds of megacycles. Theoretically, the high switching speed of the device now permits electronic circuits and particularly bistable pulse circuits to be developed with little or no limitations regarding the input pulse repetition rate to the circuits. Practically, however, it is difficult to provide simple biasing circuitry which will enable the device to switch almost instantaneously for input pulse repetition rates of the order of hundreds of megacycles. The biasing circuitry is usually sufficiently complicated in construction to reduce in effect the switching speed of the device. Similarly, sensitizing the device to be reliably responsive to input pulsse of low amplitude and short duration requires circuitry which also, in effect, decreases the switching speed of the device. In addition to these practical limitations on speed, the device has the inherent disadvantage of not developing sufficient power gain to drive other switching circuits at relatively high speeds as is required in computer systems. It is desirable, therefore, to improve the circuitry associated with the new device to overcome these limitations on speed, sensitivity, and power gain so that the device may be fully exploited in computer systems with an expected reduction in costliness of such systems.

A general object of the invention is an improved bistable pulse circuit having a relatively high switching speed as compared to prior art devices and adapted to drive other pulse circuits.

One object is a switching circuit employing bistable semiconductor devices and having circuitry which has little or no effect on the operating speed of the bistable devices.

Another object is a rugged and reliable bistable pulse circuit employing a bistable semiconductor device that is uniformly responsive to input pulses of relatively short duration and low amplitude.

Another object is an electronic circuit for counting in a binary manner pulse trains having pulse repetition rates of the order of hundreds of megacycles.

Another object is an electronic circuit employing bistable semiconductor devices and responsive to input pulses as small as one nanosecond (ns.) separated in time by one nanosecond to provide output pulses which are in-phase and out-of-phase with respect to the input signals., Still another object of the invention is a switching circuit employing bistable semiconductor devices and circuitry which adjusts almost instantantously the operating point of the bistable devices after switching thereof to be responsive to an input pulse of low amplitude and short duration.

These and other objects are accomplished in the present invention, one illustrative embodiment of which comprises a plurality of negative resistance devices typically bistable semiconductor devices connected in series aiding relation, one half of the devices being in one stable operating condition and the other half being in the other stable operating condition. An input circuit is adapted to supply pulses directly to the devices. The pulses alternately switch each half of the plurality of bistable devices between stable operating conditions. A feedback or variable resistance circuit including power gain devices is connected to the bistable devices and supplies signals which affect the operating point of the devices. After switching, the feedback circuit adjusts the operating point of the bistable devices to be adjacent to their negative resistance regions. Thus, the bistable devices will switch almost instantaneously when input pulses are received and which may be of low amplitude and short duration. Output circuits are connected to the power gain devices to provide an in-phase and an out-of-phase signal with respect to the input pulses, the in-phase and out-of-phase signals having sufficient power to drive another bistable pulse circuit.

One feature of the present invention is the combination of a bistable circuit employing negative resistance devices and a feedback circuit, the combination permitting input pulse repetition rates of the order of several hundreds of megacycles to be counted in a binary manner and providing output signals which are in-phase and out-of-phase with respect to the input pulses.

Another feature is a feedback or variable resistance circuit which is suitably connected to a polarity inverter circuit employing bistable semiconductor devices such that the operating point of the devices will be automatically adjusted by the feedback circuit to be adjacent the negative resistance regions of the devices after switching thereof.

Another feature is a feedback connected to a plurality of negative resistance devices so that the devices alternately act as an in-phase voltage amplifier and then as a polarity inverting "voltage" amplifier.

Another feature is at least two bistable semiconductor devices connected in series aiding relation and having a feedback circuit connected to the junction to permit the bistable devices to be responsive to input pulses of low amplitude and short duration.

Another feature is at least two bistable semiconductor devices connected in series aiding relation and biased by suitable means to be in opposite stable operating conditions, the bistable devices being responsive to input signals to provide output signals to a two-stage emitter follower circuit having the input and output connected together and providing first and second output signals, one signal being in-phase and the other signal being out-of-phase with respect to the input signals.

Still another feature of the invention is a switching circuit employing bistable semiconductor devices and having a feedback circuit for adjusting the operating speed of the bistable devices.

The foregoing and other objects, features and advantages of the invention will be apparent from the following more particular description of a preferred embodiment of the invention, as illustrated in the accompanying drawings.

Figure 1:
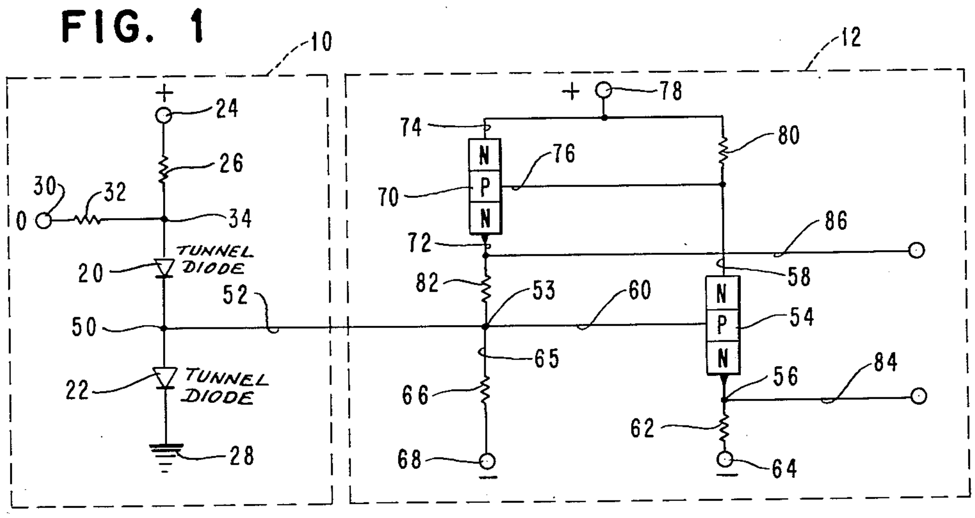
FIG. 1 is an electrical schematic of one embodiment of the present invention, showing a bistable circuit in combination with a feedback circuit.

Referring to FIG. 1, the present invention comprises a bistable circuit 10 in combination with a feedback or variable resistance circuit 12 which includes power gain devices. The circuit 10 comprises a first negative resistance device 20 and a second negative resistance device 22, the devices being connected in series aiding relation. Preferably, but not exclusively, bistable semiconductor devices are employed in the present invention. Bistable semiconductor devices are known to exist in several forms to a worker skilled in the art. One eminently satisfactory bistable semiconducting device that has been recently developed is described in an article entitled "New Phenomena in Narrow Germanium PN Junction," Physical Review, volume 109, 1958, pages 603 to 604 by L. Esaki. The device described in the previously mentioned publication is commonly referred to as a tunnel or Esaki diode. The tunnel diode has been selected as a preferred element for use in the invention because of the extreme speed of response thereof. Accordingly, the remaining paragraphs of the description will be limited to switching circuits employing the characteristics of the tunnel diode, but it should be understood that other bistable semiconductors may also be employed in the present invention with equal success.

One end of the series connected bistable devices is coupled to a voltage source 24 through a resistor 26. The magnitude of the source is selected to maintain either bistable device, but not both, in the high voltage state. The other end of the bistable device is connected to a reference point 28, typically ground. An input circuit 30 suitably modified to appear as a relatively low impedance source is connected to the devices. Typically, the input circuit 30 includes a resistor 32 connected to a node 34 which is in the common lead between the resistor 26 and the bistable device 20.

Figures 2, 3:
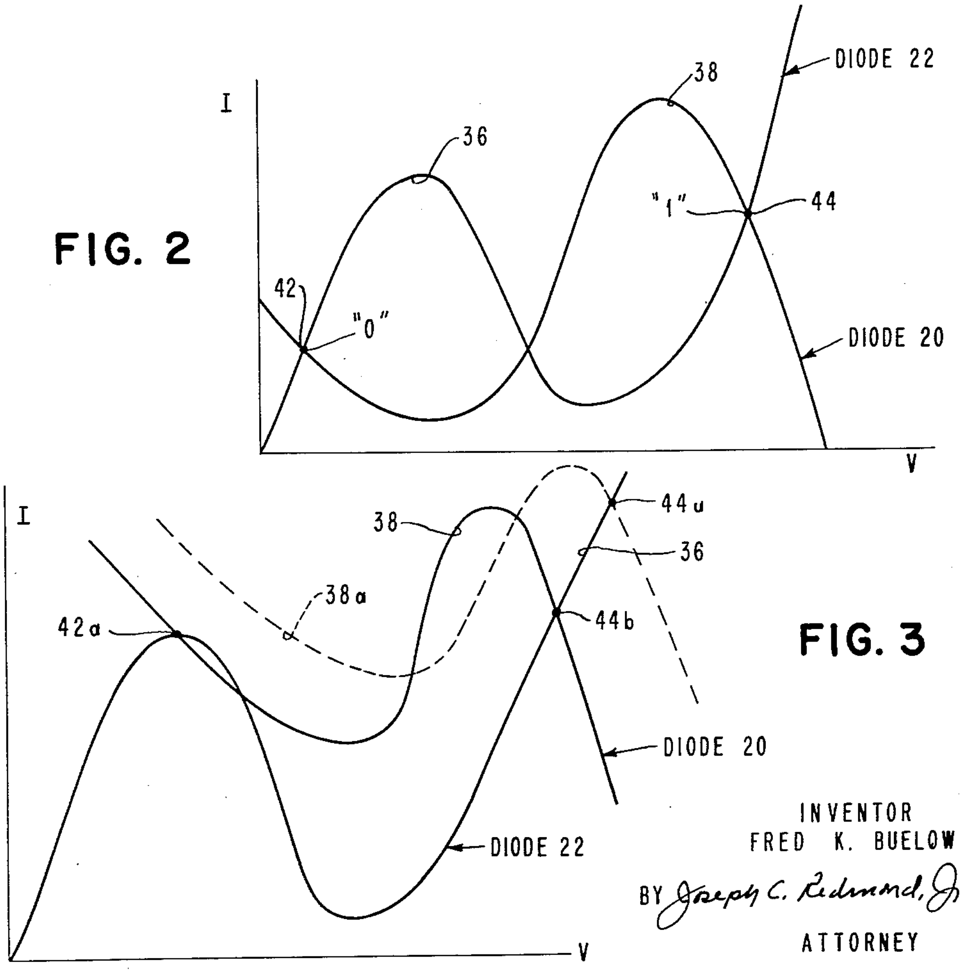
FIG. 2 is a graph of the voltage-current characteristics of the bistable semiconductor devices employed in the circuit of FIG. 1.
FIG. 3 is a graph of the voltage-current characteristic of the bistable devices and feedback circuit employed in FIG. 1, in combination, before and while a first input pulse is supplied thereto.

The normal operating condition of the diodes 20 and 22 may be ascertained from FIG. 2 which discloses a pair of curves 36 and 38. The curve 36 represents the well known voltage-current characteristic of a tunnel diode whereas the curve 38 represents a load line for the diode. Assuming that the curve 36 indicates the characteristics of the diode 22, the load line 38 indicates the characteristics of the diode 20, the source 24 and the resistors 26 and 32 with respect to the diode 22. The load line may be constructed by conventional small signal, two terminal technique specifically by plotting the volt-ampere characteristic of a terminal 50 with respect to the reference point 28, the diode 22 being removed therebetween. It will be noted that the load line 38 intersects the curve 36 at points 42 and 44 which are stable operating points. It will also be noted that when the diode 22 is in the low voltage, high current or "0" condition, the diode 20 which is the load diode, will be in the high voltage, low current or "1" condition in order to divide the source voltage 24 between the diodes 20 and 22. Similarly, when the diode 22 is in the high voltage, low current or "1" condition, the load diode 20 will be in the low voltage, high current or "0" condition.

Returning now to FIG. 1, the elements of the feedback or variable resistance circuit which are connected to the node 50 will be described. The feedback circuit may take any one of several forms and should not be limited to the circuit shown in FIG. 1. Functionally, as will be seen hereinafter, the circuit operates to take current from the node 50 or to supply current to the node 50 thereby to adjust the operating point of the diodes 20 and 22. The circuit also incorporates a time-delay feature which permits the diodes to switch before the current condition at the node is altered. Any number of circuits may be perfected by a worker skilled in the art to perform these functions. A preferred feedback circuit comprises a two-stage emitter-follower circuit having the output thereof connected to the input. The circuit 12 is coupled to the node 50 through a common lead 52. One emitter-follower stage comprises a transistor 54, typically of the NPN type having an emitter electrode 56, a collector electrode 58, and a base electrode 60. The emitter electrode is connected through a suitable resistor 62 to a source of negative potential 64. The base electrode 60 is connected to the common lead 52 as well as through a lead 65 including a resistor 66 to a source of negative potential 68. The intersection of the leads 52 and 65 establishes a node 53. The collector 58 is biased from a source 78 including a resistor 80. The collector 58 is also connected to a second stage emitter-follower comprising a transistor 70, typically of the NPN type and having an emitter electrode 72, a collector electrode 74 and a base electrode 76. The transistor 70 is biased for operation by connecting the collector 74 to the source 78 and connecting the emitter 72 through a resistor 82 to the node 53. Connecting the emitter 72 to the node 53 effectively couples the output of the second stage emitter follower to the input of the first emitter-follower. The input to the second stage emitter-follower is obtained by connecting the base 76 to the collector 58 of the first emitter-follower stage.

Initially, it will be noted that the transistor 54 is normally conducting very little or not at all since the emitter-base junction thereof is normally reversed biased by the sources 64 and 68. Accordingly, the voltage of the emitter 56 approaches that of the source 64. In contrast, the voltage of the collector approaches that of the source 78 which forward biases the emitter-base junction of the transistor 74 into the full conducting condition. With the transistor 70 fully conducting the voltage of the emitter 72 approaches that of the source 78. The voltage of the emitter 72 also raises the voltage at the node 53 to a positive value which changes the transistor 54 from non-conducting to a slightly conducting condition. Thus, normally, the transistor 54 is slightly conducting whereas the transistor 70 is full conducting.

Completing the feedback circuit are output circuits 84 and 86, which are connected to the emitters 56 and 72, respectively. It will be appreciated from the previous description of the emitter-follower circuits that when full current flows in the transistor 70, the output voltage at the terminal 86 approaches that of the positive source 78. Simultaneously, when partial current flows in the transistor 54, the output voltage at the terminal 84 approaches that of the negative source 64. These output voltages are indicated in FIG. 5 for time $t_0$.

Before describing the operation of the present invention, it will be desirable to examine the operating curves of the diodes 20 and 22 after the connection of the feedback circuit 52 to the node 50. The diodes are assumed to be in their "1" and "0" stable conditions, respectively. As indicated before, the transistor 70 is full conducting whereas the transistor 54 is slightly conducting. The positive voltage appearing at the base 60 also appears at the node 50 and raises the load line 38 on the curve 36 to the position shown in FIG. 3. An explanation for the adjusted position of the curve 38 is that the feedback circuit is supplying current to the diode 22 which raises the load line on the operating characteristic thereof. It will be also seen in FIG. 3 that the diode 22 is operating at a new point 42*a* which is immediately adjacent to the negative resistance region of the diode 22. This is an important feature since the present invention will now switch almost instantaneously when pulses are supplied to the circuit. The rapid switching is true even if pulses of low amplitude and short duration are supplied to the input circuit 30.

When a positive input pulse 88 (see FIG. 5) is supplied to the node 34, the load line 36 shifts slightly to the right as indicated by a dotted curve 38*a* on FIG. 3. The shift in the load line switches the diode 22 to a new stable operating point 44*a* in the high impedance or "1" condition of the diode. Correspondingly, the diode 20 switches from the high impedance condition to the low impedance or "0" condition in order to divide the voltage of the source 24 between the diodes. On release of the input pulses, the operating point 44*a* is slightly adjusted to a new point 44*b* in the high impedance condition of the diode. Similarly, the operating point of the diode 20 is adjusted slightly in the low impedance condition thereof. With the diode 22 in the high impedance condition, the source 24 is connected to the node 53 to forward bias the base-emitter junction of the transistor 54. Accordingly, the transistor 54 is turned on full and the collector voltage thereof decreases sufficiently to bias to a low level of conduction or effectively turn off the transistor 70. When the transistor 70 turns off, the voltage at the node 50 goes negative which lowers the load line of the diode 22 to a new position 38*c* shown in FIG. 4 and establishes an operating position 44*c*. An explanation for the adjusted position is that the diode 22 is required to supply negative current to the feedback circuit which lowers the load line of the diodes. It will be seen that now diode 20 is operating adjacent the negative resistance region thereof whereas the diode 22 is removed from the negative resistance region thereof.

Figure 5:
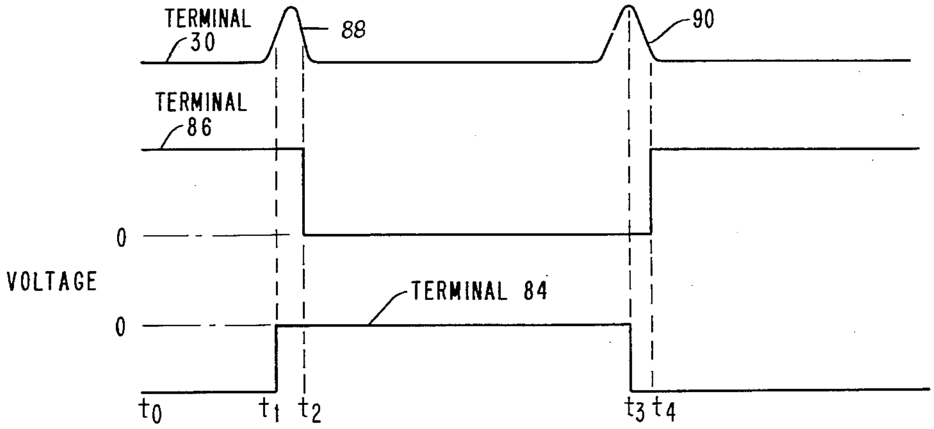
FIG. 5 is a voltage-time diagram of input pulses supplied to the embodiment of FIG. 1 and output signals received therefrom.

The output voltages at the terminals 84 and 86 appear as indicated in FIG. 5. At time $t_1$ the output voltage from the transistor 54 which appears at the terminal 86 increases almost instantaneously with the switching of the diodes 20 and 22. Shortly thereafter, at time $t_2$ the transistor 70 is biased to a low level of conduction and the output voltage at the terminal 86 decreases. It will be seen that the feedback network provides a delay which permits the operating points of the diodes to be adjusted after switching thereof. Both the transistors 54 and 70 remain conducting and cut-off respectively after the release of the input pulse since the diodes 20 and 22 remain in their other stable operating conditions. The diodes remain in these stable conditions until another input pulse is supplied to the circuit.

Figure 4:
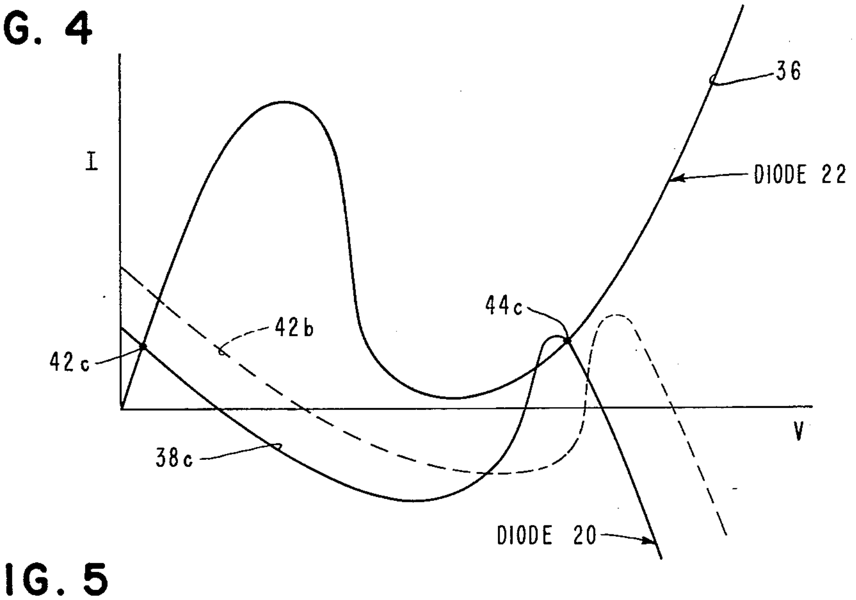
FIG. 4 is a graph of the voltage-current characteristic of the bistable devices and feedback circuit of FIG. 1, in combination, before and while a second input pulse is supplied thereto.

A second input pulse 90 (see FIG. 5) supplied to the circuit will shift the load line 38*c* to the right as shown in FIG. 4. Accordingly, the diode 20 switches to the low impedance condition and establishes a new operating point 42*b*. The diode 20 also switches to divide the voltage of the source 24 therebetween. On release of the input pulse, the operating point of the diode 22 is lowered to the point 42*c*. The source 24, as a consequence, is disconnected from the node 53. Thereafter, the source 68 biases the base-emitter junction of the transistor 54 to a low level of conduction. This raises the voltage across the base-emitter junction of the transistor 70 which is returned to the full conducting condition. When turn on of the transistor 70 occurs, the voltage at the node 50 increases positively and current is supplied to the node 50 by the transistor. The positive voltage at the node 50 raises the load line 38*c* to the position shown in FIG. 3 wherein the diode 22 is at the operating point 42*a* in the low impedance condition and adjacent to the negative resistance region of the diode.

The output voltages for the operating condition shown in FIG. 4 are indicated in FIG. 5. It will be seen that at time $t_3$ the voltage at the terminal 84 decreases due to the low conducting condition of the transistor 54 and at time $t_4$ the voltage at the terminal 86 increases due to the high conducting condition of the transistor 70. Again the time delay of the feedback network permits the operating point of the diodes to be adjusted after switching of the diodes.

Figures 6, 7:
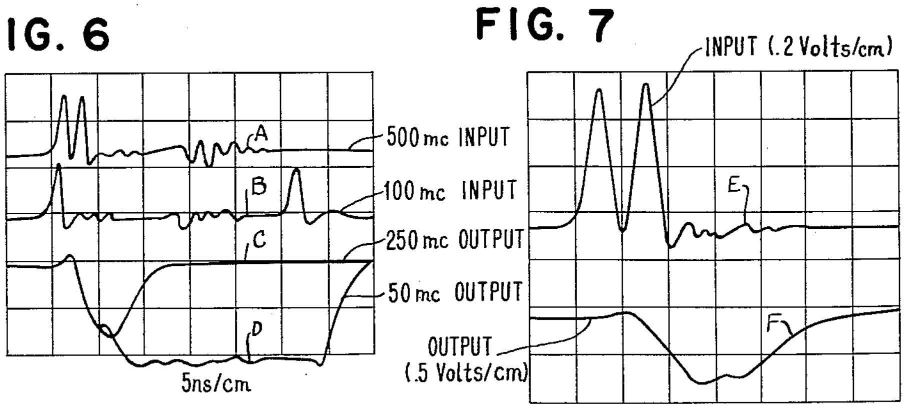
FIG. 6 is a photograph of an oscilloscope trace of the present invention in counting input pulses having a repetition rate of several hundred megacycles.
FIG. 7 is a photograph of an oscilloscope trace of the prevent invention indicating the magnitude of the input and output signals.

The speed of the present invention in counting input pulses is shown in FIG. 6 wherein a series of oscilloscope traces A through D depict the input pulses supplied to the terminal 30 and the output pulses appearing at the terminal 86. The oscilloscope employed in observing the circuit was a conventional instrument set to provide a vertical scale of .2 v. per centimeter for the A and B traces; .5 v. per centimeter for the C and D traces horizontal scale equal to 5 nanoseconds per centimeter. The trace A indicates a pair of one nanosecond input pulses separated in time by a nanosecond which is equivalent to a 500 mc. pulse repetition rate. The trace C is the output signal for the trace A and it will be seen that the first pulse drops the voltage at the terminal 86 and the second input pulse restores the voltage at the terminal. The trace C demonstrates that the present invention satisfactorily counts in a binary manner input pulses having a pulse repetition rate of 500 mc. which is unusually high as compared to present day devices.

The trace B, appearing in FIG. 6, indicates an input pulse repetition rate of 100 mc. the output voltage at the terminal 86 being reduced, as shown in the trace D, until the second input pulse is supplied to the invention whereupon the voltage at the terminal 86 is restored to the normal value. The traces B and D demonstrate that the invention, once operated, remains in the operated condition, until the next input pulse is impressed.

The voltage magnitude of the pulses impressed on the input terminal 30 and the pulses appearing at the output terminal 86 may be seen by referring to FIG. 7 wherein an oscilloscope trace E indicates an input pulse and an oscilloscope trace F indicates an output pulse. Again the oscilloscope employed in observing the invention was a conventional instrument providing a scale equal to 2 nanoseconds/centimeter along the horizontal axis; .2 volt per centimeter along the vertical axis for the input pulse; and .5 volt per centimeter along the vertical axis for the output pulse. It is believed apparent that the output signal is sufficiently strong to drive another bistable pulse circuit as is required in computer systems.

The feedback circuit 12 can be calibrated to adjust the operating points of the diodes to be adjacent to their negative resistance region in both stable operating conditions or to be adjacent the negative resistance region in one condition and removed from the negative resistance region in the other operating point. In the latter condition, the switching of the diodes will take a longer time period than in the former condition since the diodes are further removed from their negative resistance region. Thus, the present invention can be adapted to a wide degree of sensitivity depending upon the amount of feedback supplied to the node 50. Also the counting rate of the invention can be controlled by the feedback circuit. Capacitively loading the feedback circuit will vary the counting rate of the invention.

The feedback circuit in operating the diodes near their negative resistance regions, also enables input pulses of low power content to switch the diodes. The characteristics of the diodes are such that once they are driven into the negative resistance region, they switch almost instantaneously without requiring any further input power. Hence, the present invention provides a switching circuit which in response to input pulses of low amplitude and power content drives the diodes into their negative resistance region due to the feedback circuit adjusting the operating points of the diodes to be near their negative resistance region.

Thus, in view of the foregoing, the present invention provides a switching circuit which may be advantageously employed in computer systems. The circuit is uniquely adapted to count in a binary manner input pulse repetition rates of the order of several hundred megacycles. Also, the invention provides power gain sufficient to drive another pulse circuit and in a preferred embodiment employs bistable semiconductors having characteristics of rapid switching speed, ruggedness and inexpensiveness which are fully utilized by the circuitry asociated with the devices.

While the invention has been particularly shown and described with reference to a preferred embodiment thereof, it will be understood by those skilled in the art that vraious changes in form and details may be made therein without departing from the spirit and scope of this invention.

What is claimed is:

1. A bistable pulse circuit comprising at least two bistable semiconductor devices suitably biased to be in opposite operating conditions, an input circuit connected to said bistable devices and adapted to supply input pulses which alternately switch the bistable devices between stable operating states, a feedback circuit adapted to adjust the operating point of the bistable devices to be responsive to input pulses of low amplitude and short duration to provide an output signal which is the inverse of the input signal.

2. A bistable pulse circuit comprising at least two bistable semiconductor devices suitably biased to be in opposite operating conditions, each bistable device having a negative resistance region, means for supplying input pulses to said bistable devices, a feedback circuit for adjusting the operating point of each bistable device to be adjacent the negative resistance region thereof, and output circuits coupled to said feedback circuit.

3. A bistable pulse circuit comprising at least two bistable semiconductor devices suitably biased to be in opposite operating conditions, said bistable devices being connected in series and having a common junction therebetween, each bistable device having a negative resistance region, an input circuit connected to said bistable devices and adapted to supply input pulses which alternately switch the bistable devices between stable operating states, a feedback circuit connected to the junction between the bistable devices and adapted to adjust the operating point of each device to be adjacent the negative resistance region thereof, and output circuits to supply output pulses which are in-phase and out-of-phase with respect to the input pulses.

4. A bistable pulse circuit comprising at least two bistable semiconductor devices suitably biased to be in opposite operating conditions, said bistable devices being connected in series and having a common junction therebetween, means for supplying input pulses to said bistable devices, and a feedback circuit including power gain devices connected to the junction between the bistable devices, said feedback circuit adapted to adjust the operating point of the bistable devices to be responsive to input pulses of low amplitude and short duration to provide output signals sufficient to drive another pulse circuit.

5. A bistable pulse circuit comprising at least two bistable semiconductor devices suitably biased to be in opposite operating conditions, said bistable devices being connected in series and having a common junction therebetween, each bistable device having a negative resistance region, an input circuit connected to said bistable devices and adapted to supply input pulses which alternately switch the bistable devices between stable operating conditions, a feedback circuit including means for adjusting the operating point of each bistable device to be adjacent the negative resistance region thereof after an input pulse switches the bistable devices to their other operating state, and output means for providing signals which are in and out-of-phase with respect to the input pulse.

6. A bistable pulse circuit comprising at least two bistable semiconductor devices suitably biased to be in opposite operating conditions, said bistable devices being connected in series aiding relation and having a common junction therebetween, each bistable device having a negative resistance region, an input circuit connected to one of the bistable devices and adapted to supply input pulses which alternately switch the bistable devices between stable operating conditions, a feedback circuit including a two-stage transistor amplifier having the input and an output circuit connected together to form a common node, said common junction connected to said common node, and an output circuit connected to each transisor stage to provide output signals, one signal being in and the other signal being out-of-phase with respect to the input pulses.

7. A bistable pulse circuit comprising at least two bistable semiconductor devices connected in aiding series relation and having a common junction therebetween, said bistable device being connected between a source of voltage including an impedance device and a reference point, said source of voltage supply and impedance means adapted to bias the bistable devices into opposite operating conditions, an input circuit connected to a junction between the impedance and one of the bistable devices, said input circuit adapted to supply input pulses which alternately switch the bistable devices between stable operating conditions, a feedback circuit connected to the common junction between the bistable devices, said feedback circuit including a first emitter-follower transistor amplifier having an output connected to a second emitter-follower transistor amplifier, an output from the second emitter-follower transistor amplifier being connected to the input of the first emitter-follower transistor so that at any instant one amplifier will be full conducting and the other amplifier will be slightly conducting, an output circuit connected to the emitter of the first transistor amplifier to provide output signals which are in-phase with respect to the input signal, and an output circuit connected to the emitter of the second transistor amplifier to provide output signals which are out-of-phase with respect to the input signal.

No references cited.